(12) United States Patent
Pasqualini

(10) Patent No.: US 6,489,825 B1
(45) Date of Patent: Dec. 3, 2002

(54) HIGH SPEED, LOW POWER, MINIMAL AREA DOUBLE EDGE TRIGGERED FLIP FLOP

(75) Inventor: Ronald Pasqualini, Los Altos, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 09/948,746

(22) Filed: Sep. 7, 2001

(51) Int. Cl.[7] ............................................. H03K 3/356
(52) U.S. Cl. ...................... 327/211; 327/201; 327/407; 365/189.02; 365/156
(58) Field of Search ................................. 327/199–202, 327/203, 208, 210–212, 215, 218, 403, 404, 407, 408; 326/52, 55, 93–98, 113, 119, 121; 365/189.02, 154, 156, 205, 230.02

(56) References Cited

U.S. PATENT DOCUMENTS 4,629,909 A * 12/1986 Cameron .................... 327/211
5,844,844 A * 12/1998 Bauer et al. ............ 365/189.02
5,982,211 A * 11/1999 Ko ............................... 327/202
5,995,420 A * 11/1999 Hesley ......................... 326/52

* cited by examiner

Primary Examiner—Timothy P. Callahan
Assistant Examiner—Minh Nguyen
(74) Attorney, Agent, or Firm—Mark C. Pickering

(57) ABSTRACT

The propagation delay time, power dissipation and silicon area of a double edge triggered flip flop are reduced by utilizing an inverter, a pair of latches, and a two-to-one multiplexer. A first latch outputs a first device signal in response to a first data signal when a clock signal is in a first logic state, and latches the logic state of the first device signal when the clock signal is in a second logic state. A second latch outputs a second device signal in response to a second data signal when the clock signal is in the second logic state, and latches the logic state of the second device signal when the clock signal is in the first logic state. The multiplexer controls the logic state of the flop output signal in response to the logic state of the first device signal when the clock signal is in the second logic state, and in response to the logic state of the second device signal when the clock signal is in the first logic state.

18 Claims, 3 Drawing Sheets

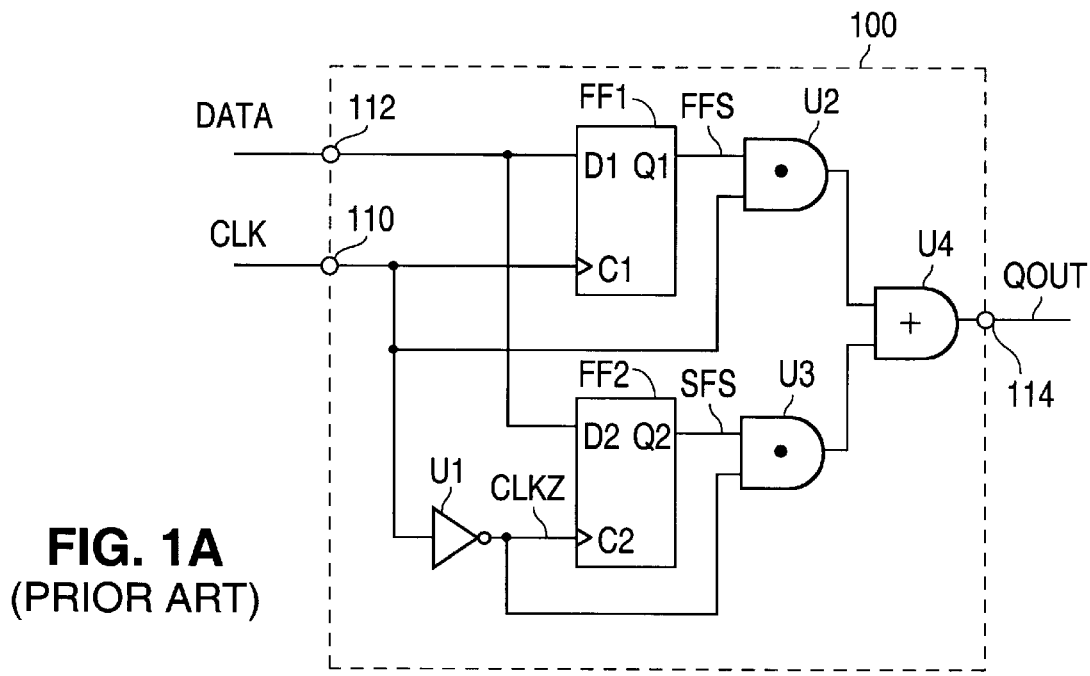
FIG. 1A
(PRIOR ART)
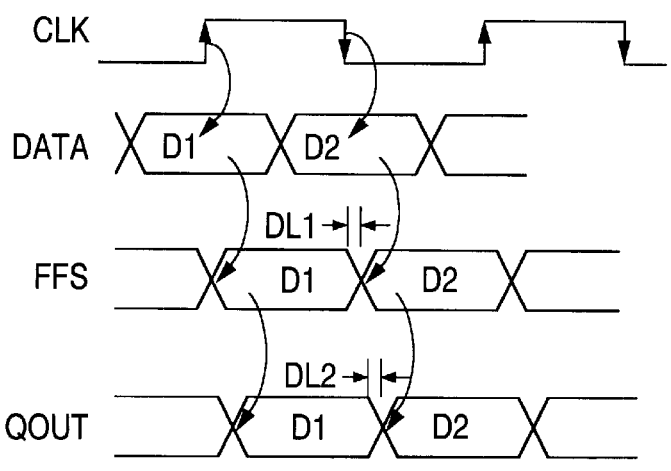
FIG. 1B1
(PRIOR ART)
FIG. 1B2
(PRIOR ART)
FIG. 1B3
(PRIOR ART)
FIG. 1B4
(PRIOR ART)

HIGH SPEED, LOW POWER, MINIMAL AREA DOUBLE EDGE TRIGGERED FLIP FLOP

BACKGROUND OF THE INVENTION

1. Field of the Invention

The present invention relates to flip flops and, more particularly, to a high speed, low power, minimal area double edge triggered flip flop.

2. Description of the Related Art

A rising edge triggered flip flop is a device which latches and holds the logic state of its data input signal when the rising edge of its clock input signal is detected.

Similarly, a falling edge triggered flip flop is a device which latches and holds the logic state of its data input signal when the falling edge of its clock input signal is detected.

Therefore, a double edge triggered flip flop is a device which latches and holds the logic state of its data input signal when the rising edge or the falling edge of its clock input signal is detected. Double edge triggered flip flops are commonly used in double data rate RAMs and in high speed bus interfaces.

FIG. 1A shows a circuit diagram which illustrates a conventional double edge triggered flip flop 100. As shown in FIG. 1A, flop 100 includes a clock inverter U1 whose input 110 is connected to an external clock signal CLK. The output of clock inverter U1 generates an inverted clock signal CLKZ.

Flop 100 also includes a first flip flop FF1 and a second flip flop FF2. Flop FF1 has a data input D1 which is connected to an external data input 112, receiving a data signal DATA. Flipflop FF1 also has a clock input C1 which is connected to external clock input 110, receiving a clock signal CLK. Furthermore, flop FF1 also has an output Q1 which generates a first flop output signal FFS.

Similarly, Flop FF2 has a data input D2 which is connected to external data input 112, receiving a data signal DATA. Flipflop FF2 also has a clock input C2 which is connected to the output of inverter U1, receiving an inverted clock signal CLKZ. Furthermore, flop FF2 also has an output Q2 which generates a second flop output signal SFS.

As further shown in FIG. 1A, flop 100 also includes a pair of 2-input AND gates U2 and U3, and a 2-input OR gate U4. AND gate U2 has an output, a first input connected to Q1, the output of flop FF1, and a second input 110, connected to external clock input CLK.

AND gate U3 has an output, a first input connected to Q2, the output of flip flop FF2, and a second input connected to the output of clock inverter U1, receiving the inverted clock signal CLKZ. OR gate U4 has a first input connected to the output of AND gate U2, a second input connected to the output of AND gate U3, and an output connected to external output 114, generating the flop output signal QOUT.

FIGS. 1B1–1B4 show timing diagrams which illustrate the operation of flop 100. As shown in FIGS. 1A and 1B1–1B4, the rising edge of the CLK input signal on external clock input 110 causes flop FF1 to latch the logic state of the data input signal DATA on external data input 112. When latched, the logic state of the first flop output signal FFS, generated by flip flop output Q1, matches the logic state of the data input signal DATA.

When the clock rises, the logic state of the data signal DATA, at data input D1, is transferred to output Q1 of flip flop FF1, determining the logic state of the first flop signal FFS. For example, if the data input signal DATA is a logic high when the rising edge of the clock signal CLK is detected, the first flop signal FFS will be set to a logic high.

Furthermore, the rising edge of the clock signal CLK on the second input of AND gate U2 enables AND gate U2 to pass the logic state of the first flop output signal FFS. At almost the same time, the second input of AND gate U3 receives the falling edge of the inverted clock signal CLKZ output from clock inverter U1. This falling edge disables AND gate U3, causing AND gate U3 to output a logic low.

The logic low output by AND gate U3 enables OR gate U4 to pass the logic state output by AND gate U2 to QOUT, the flop output signal. Thus, when the clock rises, the logic state of the data signal DATA is transferred to flip flop FF1 output Q1, which is in turn transferred through AND gate U2 and OR gate U4 to external output 114, determining the logic state of the flop output signal QOUT.

Similarly, the falling edge of the clock signal CLK, on external clock input 110, causes the rising edge of the inverted clock signal CLKZ to be output from clock inverter U1. The rising edge of the inverted clock signal CLKZ causes flip flop FF2 to latch the logic state of the DATA input signal at input 112. When latched, the logic state of the second flop signal SFS, at output Q2 of FF2, matches the logic state of the data input signal DATA. When the clock falls, the logic state of the data signal DATA at data input D2 is transferred to output Q2 of flip flop FF2, determining the logic state of the second flop signal SFS. For example, if the data signal DATA is a logic low when the rising edge of the inverted clock signal CLKZ is detected, then the second flop output signal SFS will be set to a logic low.

Furthermore, the rising edge of the inverted clock signal CLKZ on the second input of AND gate U3 enables AND gate U3 to pass the logic state of the second flop output signal SFS. At almost the same time, the second input of AND gate U2 receives the falling edge of clock signal CLK. This falling edge disables AND gate U2, causing AND gate U2 to output a logic low.

The logic low output by AND gate U2 enables OR gate U4 to pass the logic state output by AND gate U3 to QOUT, the flop output signal. Thus, when the clock falls, the logic state of the data input signal DATA is transferred to Q2, the output of flip flop FF2, which is in turn transferred through AND gate U3 and OR gate U4 to external output 114, determining the logic state of the flop output signal QOUT.

One of the drawbacks of flop 100 is that it consumes a large amount of silicon area and a large amount of power. As noted above, flop 100 requires two flip flops, two AND gates, one OR gate, and one inverter.

Furthermore, the clock-to-output delay of flop 100 is excessive because the worst case propagation path includes four logic elements. Thus, when the CLK signal falls, the flop output signal QOUT cannot change state until the CLK signal propagates through inverter U1, and the DATA signal propagates through flip flop FF2, AND gate U3, and OR gate U4.

Referring to FIGS. 1B1–1B4, delay time DL1 represents the time required for the CLK signal to propagate through inverter U1, plus the clock-to-data delay time required for the DATA signal to propagate through flop FF2.

Similarly, delay time DL2 represents the time required for the data signal to propagate through AND gate U3 and OR gate U4. Thus, at a delay time DL2 after delay time DL1, the logic state of the flop output signal QOUT will be determined.

From the foregoing discussion, it can be seen that the total clock-to-data output delay for flop 100 is equal to DL1+ DL2, which is excessive. Thus there is a definite need for a double edge triggered flip flop which requires less propagation delay time, less power, and less silicon area.

SUMMARY OF THE INVENTION

The double edge triggered flip flop of the present invention reduces the following flop parameters: clock-to-output propagation delay, power dissipation and silicon area.

A flip flop in accordance with the present invention includes a first device which has a first input connected to a clock signal, a second input connected to a first data signal, and a first device output signal. The clock signal alternates between a first logic state and a second logic state.

The first device generates the first device output signal in response to the first data signal, when the clock signal is in the first logic state. Furthermore, the first device holds the logic state of the first device output signal in the state which is present when the clock signal transitions from its first logic state to its second logic state.

The flip flop of the present invention also includes a second device which has a third input connected to the clock signal, a fourth input connected to a second data signal, and a second device output signal. The second device generates the second device output signal in response to the second data signal, when the clock signal is in the second logic state. Furthermore, the second device holds the logic state of the second device output signal in the state that is present when the clock signal transitions from its second logic state to its first logic state.

The flip flop also includes a multiplexer which has a fifth input connected to the first device output signal, a sixth input connected to the second device output signal, a seventh input connected to the clock signal, and a flop output which generates a flop output signal.

The multiplexer sets the logic state of the flop output signal in response to the logic state of the first device output signal when the clock signal is in the second logic state, and sets the logic state of the flop output signal in response to the logic state of the second device output signal when the clock signal is in the first logic state.

A better understanding of the features and advantages of the present invention will be obtained by reference to the following detailed description and accompanying drawings, which set forth an illustrative embodiment of the principles upon which the invention is based.

BRIEF DESCRIPTION OF THE DRAWINGS

FIG. 1A is a circuit diagram illustrating a conventional double edge triggered flip flop 100.

FIGS. 1B1–1B4 are timing diagrams illustrating the operation of flop 100.

DETAILED DESCRIPTION

Figure 2:
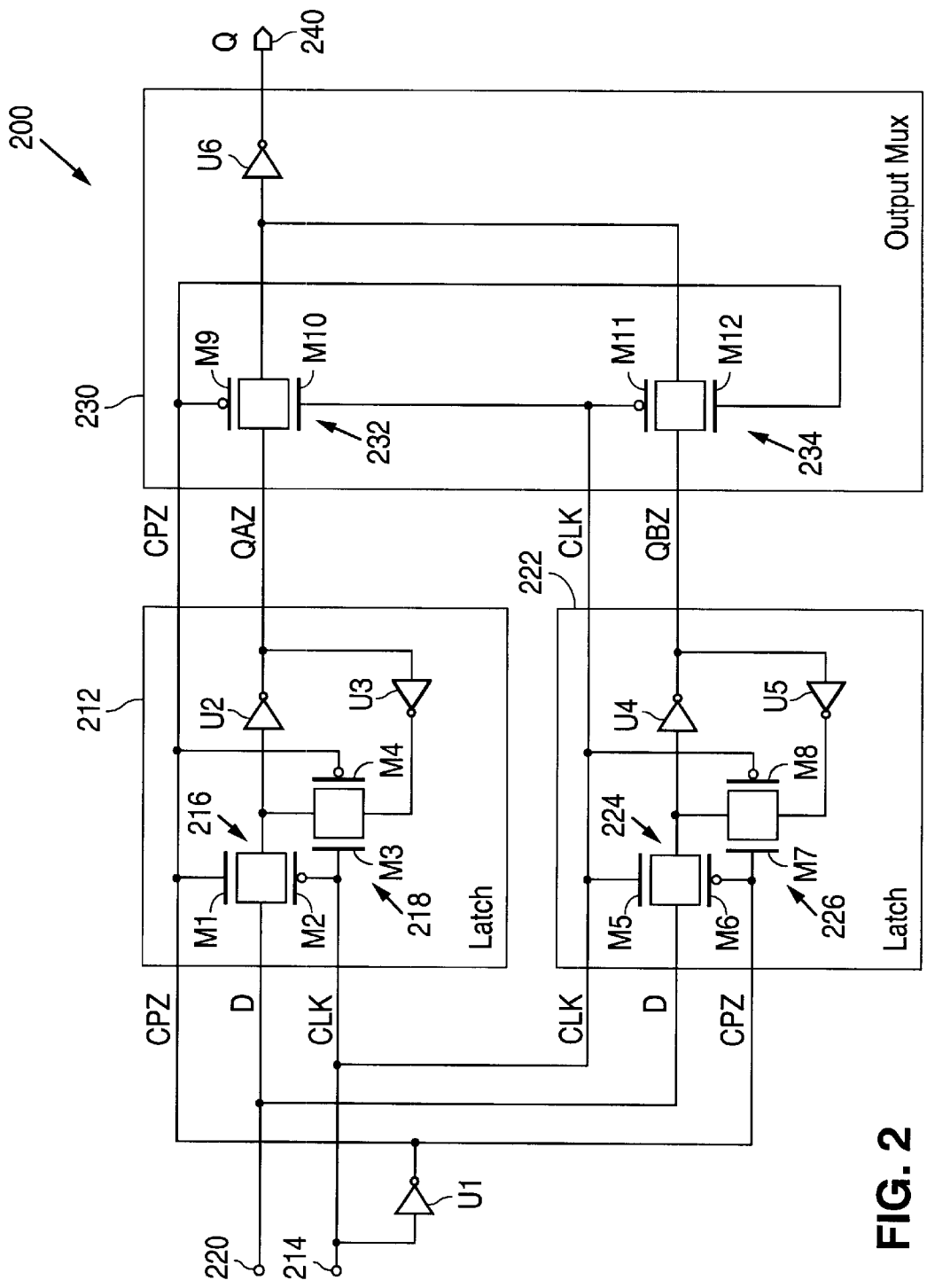
FIG. 2 is a schematic diagram illustrating a double edge triggered flip flop 200 in accordance with the present invention.

FIG. 2 shows a schematic diagram which illustrates a double edge triggered flip flop 200 in accordance with the present invention. As shown in FIG. 2, flop 200 includes a clock inverter U1 and a first master latch 212. Clock inverter U1 has a CLK input connected to an external clock input 214, and an output which generates an inverted clock signal CPZ.

First master latch 212 includes a first transmission gate 216 and a second transmission gate 218. First transmission gate 216 includes a n-channel transistor M1 which has a drain connected to an external data input 220 to receive a data signal D, a source, and a gate connected to the output of clock inverter U1 to receive the inverted clock signal CPZ. First transmission gate 216 also includes a p-channel transistor M2 which has a source connected to external data input 220 to receive the data signal D, a drain connected to the source of transistor M1, and a gate connected to external clock input 214 to receive the clock signal CLK.

Second transmission gate 218 includes an n-channel transistor M3 which has a drain, a source connected to the source of transistor M1, and a gate connected to external clock input 214 to receive the clock signal CLK. Second transmission gate 218 also includes a p-channel transistor M4 which has a source connected to the drain of transistor M3, a drain connected to the source of transistor M3, and a gate connected to the output of clock inverter U1 to receive the inverted clock signal CPZ.

In addition to first transmission gate 216 and second transmission gate 218, first master latch 212 also includes an inverter U2 which has an input connected to the source of transistor M1 and an output which generates a first latched signal QAZ. First master latch 212 also includes an inverter U3 which has an input connected to the output of inverter U2, and an output connected to the drain of transistor M3.

Flop 200 also includes a second master latch 222 which, in the example shown in FIG. 2, is identical to first master latch 212. Second master latch 222 includes a third transmission gate 224 and a fourth transmission gate 226. Third transmission gate 224 includes a n-channel transistor M5 and a p-channel transistor M6.

Transistor M5 has a drain connected to external data input 220 to receive the data signal D, a source, and a gate connected to external clock input 214 to receive the clock signal CLK. Transistor M6 has a source connected to external data input 220 to receive the data signal D, a drain connected to the source of transistor M5, and a gate connected to the output of clock inverter U1 to receive the inverted clock signal CPZ.

Fourth transmission gate 226 includes an n-channel transistor M7 which has a drain, a source connected to the source of transistor M5, and a gate connected to the output of clock inverter U1 to receive the inverted clock signal CPZ. Fourth transmission gate 226 also includes a p-channel transistor M8 which has a source connected to the drain of transistor M7, a drain connected to the source of transistor M7, and a gate connected to external clock input 214 to receive the clock signal CLK.

In addition to transmission gates 224 and 226, second master latch 222 also includes an inverter U4 which has an input connected to the source of transistor M5 and an output which generates a second latched signal QBZ. Inverter U4 is identical to inverter U2 and, as a result, has rise and fall times which are identical to the rise and fall times of inverter U2. Second master latch 222 also includes an inverter U5 which has an input connected to the output of inverter U4, and an output connected to the drain of transistor M7.

Since master latches 212 and 222 are both identical, the widths and lengths of the following transistor pairs are also identical: M1/M5, M2/M6, M3/M7 and M4/M8.

Furthermore, the device sizes in inverters U2 and U4 can be adjusted to form rise and fall times which are identical.

As shown in FIG. 2, flop 200 includes an inverting 2-to-1 output multiplexer 230 which is connected to first master latch 212 and second master latch 222. Multiplexer 230 includes a fifth transmission gate 232, a sixth transmission gate 234, and an inverter U6. In the example shown in FIG. 2, fifth transmission gate 232 and sixth transmission gate 234 are identical.

Fifth transmission gate 232 includes a p-channel transistor M9 and a n-channel transistor M10. Transistor M9 has a drain, a source connected to the output of inverter U2 to receive the first latched signal QAZ, and a gate connected to the output of clock inverter U1 to receive the inverted clock signal CPZ. Transistor M10 has a source connected to the drain of transistor M9, a drain connected to the source of transistor M9, and a gate connected to external clock input 214 to receive the clock signal CLK.

Sixth transmission gate 234 includes a p-channel transistor M11 and an n-channel transistor M12. Transistor M11 has a drain, a source connected to the output of inverter U4 to receive the second latched signal QBZ, and a gate connected to external clock input 214 to receive he clock signal CLK.

Transistor M12 has a source connected to the drain of transistor M11, a drain connected to the source of transistor M11, and a gate connected to the output of clock inverter U1 to receive the inverted clock signal CPZ. Inverter U6 has an input which is connected to the source of transistor M10 and the source of transistor M12, and an output which is connected to an external data output 240 to drive a flop output signal Q.

Since transmission gates 232 and 234 are identical, the widths and lengths of the following transistor pairs are also identical: M9/M11 and M10/M12. Furthermore, the device sizes of inverter U6 can be chosen such that the rise and fall times of the flop output signal Q, at external output 240, are identical.

In operation, when the clock signal CLK is low, transistors M1 and M2 are turned on, while transistors M3/M4 and M9/M10 are turned off. As a result, the logic state of the data signal D on external data input 220 propagates through transmission gate 216, and is inverted by inverter U2 to set the logic state of the first latched output signal QAZ. In addition, inverter U3 inverts the logic state of the output of inverter U2.

Thus, assuming adequate set up time, inverters U2 and U3 will have responded to the logic state of the data signal D, and will be in a non-changing, steady-state condition just before the clock signal CLK rises. As a result, the logic state of the first latched signal QAZ will also be in a non-changing, steady-state condition just before the clock signal CLK rises.

When the clock signal CLK rises, transistors M1 and M2 are turned off, while transistors M3/M4 and M9/M10 are turned on. As a result, the logic state of the first latched signal QAZ propagates through transmission gate 232, and is inverted by inverter U6 to determine the logic state of the flop output signal Q.

Similarly, when the clock signal CLK is high, transistors M5 and M6 are turned on, while transistors M7/M8 and M11/M12 are turned off. As a result, the logic state of the data signal D on external data input 220 propagates through transmission gate 224, and is inverted by inverter U4 to determine the logic state of the second latched output signal QBZ. In addition, inverter U5 inverts the logic state of the output of inverter U4.

Thus, assuming adequate set up time, inverters U4 and U5 will have responded to the logic state of the data signal D, and will be in a non-changing, steady-state condition just before the clock signal CLK falls. As a result, the logic state of the second latched signal QBZ will also be in a non-changing, steady-state condition just before the clock signal CLK falls.

When the clock signal CLK falls, transistors M5 and M6 are turned off, while transistors M7/M8 and M11/M12 are turned on. As a result, the logic state of the second latched signal QBZ propagates through transmission gate 234, and is inverted by inverter U6 to determine the logic state of the flop output signal Q.

Thus, during the first half of the clock cycle, when the clock input signal CLK is low, first master latch 212 will output the first latched signal QAZ with a logic state in response to the data input signal D. Furthermore, during the second half of the clock cycle, when the clock input signal CLK is high, first master latch 212 will latch (or hold) the logic state of the first latched signal QAZ. The latched logic state of QAZ is the state which was present when the clock transitioned from its logic low state to its logic high state.

Referring to FIG. 2, it can be seen that second master latch 222 is 180° out-of-phase with respect to first master latch 212. Thus, during the first half of the clock cycle, when the clock input signal CLK is low, second master latch 222 will latch (or hold) the logic state of the second latched signal QBZ. Furthermore, during the second half of the clock cycle, when the clock input signal CLK is high, second master latch 222 will output the second latched signal QBZ with a logic state in response to the data input signal D.

Referring to FIG. 2, during the first half of the clock cycle, when the clock input signal CLK is low, multiplexer 230 sets the logic state of the flop output signal Q in response to the logic state of the second latched signal QBZ output by latch 222. Furthermore, during the second half of the clock cycle, when the clock input signal CLK is high, multiplexer 230 sets the logic state of the flop output signal Q in response to the logic state of the first latched signal QAZ output by latch 212.

The load capacitance seen by inverter U2 of first master latch 212 is the same as the load capacitance seen by inverter U4 of second master latch 222 (regardless of whether the clock is high or low). As a result, the waveforms at external output 240 are the same, independent of whether external output 240 is being driven by transmission gate 232 or transmission gate 234.

Furthermore, since inverter U6 can be made to have equal rise and fall times, the flop output signal Q on external output 240 can be made symmetric, independent of whether the clock signal CLK is rising or falling. In particular, the rise and fall times of the flop output signal Q can be made identical, resulting in zero time skew about the rising or falling edges of the clock signal CLK.

An important advantage of flop 200 is that it occupies significantly less silicon area in comparison to prior art flops. Thus flop 200 only requires 24 transistors: six transmission gates with two transistors each, and six inverters with two transistors each. This is significantly less than the number of transistors required to implement flop 100 using two flip flops, two AND gates, one OR gate and one inverter.

Furthermore, since flop 200 has much fewer transistors than flop 100, it also has much lower power dissipation than flop 100.

Another important advantage of flop 200 is that it has less clock to output valid delay in comparison to other double edge triggered flops in the prior art. Thus, referring to FIG. 2, when the clock signal CLK falls, the flop output signal QOUT cannot change state until the clock signal CLK propagates through inverter U1, and the second latched signal QBZ propagates through transmission gate 234 and inverter U6. This is significantly less than the clock to output valid delay time required by flop 100 (i.e.—through inverter U1, flip flop FF2, AND gate U3, and OR gate U4).

In a first alternate embodiment of the present invention, first master latch 212 and second master latch 222 receive data from different data sources, in order to accommodate applications where rising edge data and falling edge data come from different data sources.

Figure 3:
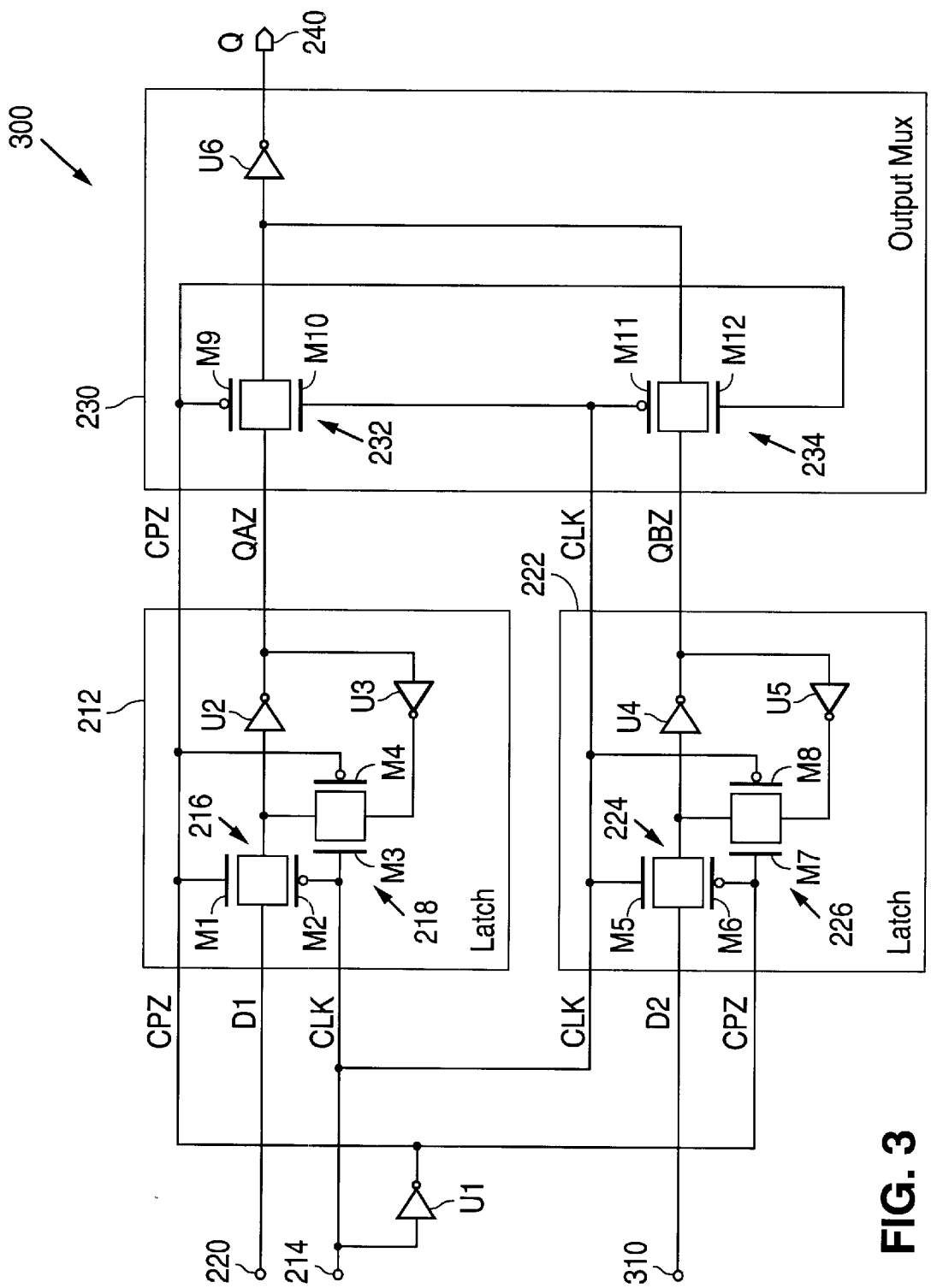
FIG. 3 is a schematic diagram illustrating a double edge triggered flip flop 300 in accordance with an alternate embodiment of the present invention.

Thus, in accordance with an alternate embodiment of the present invention, FIG. 3 shows a schematic diagram which illustrates a double edge triggered flip flop 300. Flop 300 is similar to flop 200 and, as a result, utilizes the same reference numerals to designate the structures which are common to both flops. As shown in FIG. 3, flop 300 differs from flop 200 in that transmission gate 216 is connected to external data input 220 to receive a data signal D1, and transmission gate 224 is connected to an external data input 310 to receive a data signal D2.

Thus, the logic state of the data signal D1 on data input 220 drives first master latch 212, while the logic state of the data signal D2 on data input 310 drives second master latch 222.

The voltage on data input 220 is sampled while the clock signal CLK is low, and the sampled value is output as flop output signal Q when the clock signal CLK goes high. Similarly, the voltage on data input 310 is sampled while the clock signal CLK is high, and the sampled value is output, as the flop output signal Q, when the clock signal CLK goes low.

An important advantage of flop 300 is that it efficiently solves the two data stream problem without increasing the area or the power dissipation of the flop. Furthermore, flop 300 solves the 2 data stream problem without degrading the maximum operating frequency of the flop.

In a second alternate embodiment of the present invention, rising edge and falling edge data that come from 2 different sources can be accommodated by placing a 2-to-1 multiplexer in front of external data input 220. This is not a good solution to the 2 data stream problem, however, because it decreases the maximum operating frequency of the flop and increases the size and power dissipation in comparison to flop 300.

It should be understood that various alternatives to the embodiment of the invention described herein may be employed in practicing the invention. Thus, it is intended that the following claims define the scope of the invention and that methods and structures within the scope of these claims and their equivalents be covered thereby.

What is claimed is:

1. A flip flop comprising:
    a first device having a first input that receives a clock signal, a second input that receives a first data signal, and a first output that outputs a first device signal, the clock signal alternating between a first logic state and a second logic state, the first device outputting the first device signal with a logic state in response to the first data signal when the clock signal is in the first logic state, and holding the logic state of the first device signal to a state that is present when the clock signal transitions from the first logic state to the second logic state when the clock signal is in the second logic state;
    a second device having a third input that receives the clock signal, a fourth input that receives a second data signal, and a second output that outputs a second device signal, the second device outputting the second device signal with a logic state in response to the second data signal when the clock signal is in the second logic state, and holding the logic state of the second device signal to a state that is present when the clock signal transitions from the second logic state to the first logic state when the clock signal is in the first logic state; and
    a multiplexer having a fifth input connected to the first output, a sixth input connected to the second output, a seventh input connected to the clock signal, and a flop output that outputs a flop output signal, the multiplexer setting a logic state of the flop output signal in response to the logic state of the first device signal when the clock signal is in the second logic state, and setting the logic state of the flop output signal in response to the logic state of the second device signal when the clock signal is in the first logic state, the multiplexer including:
        a first transmission gate connected to the first output, the first transmission gate passing the first device signal when the clock signal is in the second logic state, and blocking the first device signal when the clock signal is in the first logic state; and
        a second transmission gate connected to the second output, the second transmission gate passing the second device signal when the clock signal is in the first logic state, and blocking the second device signal when the clock signal is in the second logic state.

2. The flip flop of claim 1 and further including a first inverter connected to the output of the first transmission gate and the output of the second transmission gate.

3. The flip flop of claim 2 wherein the first device includes a third transmission gate that passes the first data signal when the clock signal is in the first logic state, and blocks the first data signal when the clock signal is in the second logic state.

4. The flip flop of claim 3 wherein the first device further includes a second inverter having an input connected to an output of the third transmission gate, and an output that outputs the first device signal.

5. The flip flop of claim 4 wherein the first device further includes:
    a third inverter having an input connected to the output of the second inverter, and an output; and
    a fourth transmission gate connected to the input of the second inverter and the output of the third inverter.

6. The flip flop of claim 3 wherein the second device includes a fourth transmission gate that passes the second data signal when the clock signal is in the second logic state, and blocks the second data signal when the clock signal is in the first logic state.

7. The flip flop of claim 6 wherein the second device further includes a second inverter having an input connected to an output of the fourth transmission gate, and an output that outputs the second device signal.

8. The flip flop of claim 7 wherein the second device further includes:
    a third inverter having an input connected to the output of the second inverter, and an output; and
    a fifth transmission gate connected to the input of the second inverter and the output of the third inverter.

9. The flip flop of claim 1 wherein the first data signal and the second data signal can be different signals or the same signal.

10. A flip flop comprising:
a first inverter having an input connected to receive a clock signal and an output that outputs an inverted clock signal;
a first latch having a first input connected to the clock signal, a second input connected to a first data signal, and a first output that outputs a first latch signal, the clock signal alternating between a first logic state and a second logic state, the first latch outputting the first latch signal with a logic state in response to the first data signal when the clock signal is in the first logic state, and holding the logic state of the first latch signal to a state that is present when the clock signal transitions from the first logic state to the second logic state when the clock signal is in the second logic state;
a second latch having a third input connected to the inverted clock signal, a fourth input connected to a second data signal, and a second output that outputs a second latch signal, the second latch outputting the second latch signal with a logic state in response to the second data signal when the inverted clock signal is in the first logic state, and holding the logic state of the second latch signal to a state that is present when the inverted clock signal transitions from the first logic state to the second logic state when the inverted clock signal is in the second logic state; and
a multiplexer having a fifth input connected to the first latch, a sixth input connected to the second latch, a seventh input connected to the clock signal, an eighth input connected to the inverted clock signal, and an output that outputs a flop output signal, the multiplexer setting a logic state of the flop output signal in response to the logic state of the first latch signal when the clock signal is in the second logic state, and setting the logic state of the flop output signal in response to the logic state of the second latch signal when the inverted clock signal is in the second logic state, the multiplexer including:
a first transmission gate connected to the first output, the first transmission gate passing the first latch signal when the clock signal is in the second logic state, and blocking the first latch signal when the clock signal is in the first logic state; and
a second transmission gate connected to the second output, the second transmission gate passing the second latch signal when the clock signal is in the first logic state, and blocking the second latch signal when the clock signal is in the second logic state.

11. The flip flop of claim 10 and further including a first inverter connected to the output of the first transmission gate and the output of the second transmission gate.

12. The flip flop of claim 11 wherein the first latch includes a third transmission gate that passes the first data signal when the clock signal is in the first logic state, and blocks the first data signal when the clock signal is in the second logic state.

13. The flip flop of claim 12 wherein the third transmission gate includes:
a first transistor having a gate connected to the clock signal; and
a second transistor connected to the first transistor, the second transistor having a gate connected to the inverted clock signal.

14. The flip flop of claim 13 wherein the first latch further includes:
a second inverter having an input connected to an output of the third transmission gate, and an output that outputs the first latch signal;
a third inverter having an input connected to the output of the second inverter, and an output; and
a fourth transmission gate connected to the input of the second inverter and the output of the third inverter, the fourth transmission gate having a third transistor having a gate connected to the clock signal, and a fourth transistor connected to the third transistor, the fourth transistor having a gate connected to the inverted clock signal.

15. The flip flop of claim 12 wherein the second latch includes a fourth transmission gate that passes the second data signal when the clock signal is in the second logic state, and blocks the second data signal when the clock signal is in the first logic state.

16. The flip flop of claim 15 wherein the fourth transmission gate includes:
a first transistor having a gate connected to the clock signal; and
a second transistor connected to the first transistor, the second transistor having a gate connected to the inverted clock signal.

17. The flip flop of claim 16 wherein the second latch further includes:
a second inverter having an input connected to an output of the fourth transmission gate, and an output that outputs the second latch signal,
a third inverter having an input connected to an output of the second inverter, and an output; and
a fifth transmission gate connected to the input of the second inverter and the output of the third inverter, the fifth transmission gate having a third transistor having a gate connected to the clock signal, and a fourth transistor connected to the third transistor, the fourth transistor having a gate connected to the inverted clock signal.

18. The flip flop of claim 10 wherein the first data signal and the second data signal can be different signals or the same signal.

* * * * *